US011983124B2

(12) United States Patent
Wang et al.

(10) Patent No.: US 11,983,124 B2
(45) Date of Patent: *May 14, 2024

(54) MANAGING ERROR CORRECTION CODING IN MEMORY SYSTEMS

(71) Applicant: Macronix International Co., Ltd., Hsinchu (TW)

(72) Inventors: Kuan-Chieh Wang, Taipei (TW); Shih-Chou Juan, Taoyuan (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/957,597

(22) Filed: Sep. 30, 2022

(65) Prior Publication Data

US 2023/0026403 A1  Jan. 26, 2023

Related U.S. Application Data

(63) Continuation of application No. 17/223,545, filed on Apr. 6, 2021, now Pat. No. 11,556,420.

(51) Int. Cl.
*H03M 13/45* (2006.01)
*G06F 11/10* (2006.01)
*G06F 13/16* (2006.01)

(52) U.S. Cl.
CPC ...... *G06F 13/1668* (2013.01); *G06F 11/1076* (2013.01); *H03M 13/45* (2013.01)

(58) Field of Classification Search
CPC ............ G06F 11/1076; G06F 13/1668; G06F 11/1048; G06F 11/1068; G06F 11/1012; H03M 13/45; H03M 13/356; H03M 13/3707; H03M 13/1102; H03M 13/1515; H03M 13/152; H03M 13/2957; Y02D 10/00; G11C 29/42
USPC .................................................. 714/763, 764
See application file for complete search history.

(56) References Cited

U.S. PATENT DOCUMENTS

| 7,978,516 | B2 | 7/2011 | Olbrich et al. |
| 8,291,295 | B2 | 10/2012 | Harari et al. |
| 8,806,090 | B2 | 8/2014 | Larson et al. |
| 9,898,363 | B2 * | 2/2018 | Kim .................... G06F 11/1068 |
| 10,558,397 | B2 | 2/2020 | Komai |
| 10,811,120 | B2 | 10/2020 | Wu |

(Continued)

FOREIGN PATENT DOCUMENTS

| TW | 201303718 | 1/2013 |
| TW | 201911317 A | 3/2019 |

(Continued)

*Primary Examiner* — Guy J Lamarre
*Assistant Examiner* — Osman M Alshack
(74) *Attorney, Agent, or Firm* — Fish & Richardson P.C.

(57) ABSTRACT

Methods, devices, systems, and apparatus including computer-readable mediums for managing error correction coding in memory systems are provided. In one aspect, a memory system includes a system controller configured to communicate with a host device, and a memory device coupled to the system controller. The memory device includes at least one memory and a memory controller coupled to the at least one memory. The memory controller includes an error correction code (ECC) circuit configured to perform error correction coding for data received from at least one of the system controller or the at least one memory.

16 Claims, 9 Drawing Sheets

(56) References Cited

U.S. PATENT DOCUMENTS

| | | | |
|---|---|---|---|
| 2016/0117099 A1* | 4/2016 | Prins | G06F 3/061 |
| | | | 711/103 |
| 2016/0203046 A1* | 7/2016 | Hanafusa | G06F 12/16 |
| | | | 714/764 |
| 2017/0147499 A1* | 5/2017 | Mohan | G06F 3/0688 |
| 2018/0083648 A1* | 3/2018 | Cagdaser | H03M 1/747 |
| 2019/0288707 A1* | 9/2019 | Kumar | G06F 3/0658 |
| 2020/0081773 A1* | 3/2020 | Hanham | H03M 13/2906 |
| 2020/0293400 A1* | 9/2020 | Steiner | G11C 29/52 |
| 2020/0310681 A1* | 10/2020 | Ishii | G06F 3/0679 |
| 2020/0394100 A1* | 12/2020 | Basu | G06F 11/2053 |
| 2021/0073118 A1* | 3/2021 | Masuo | G06F 3/0679 |
| 2021/0184699 A1* | 6/2021 | Kwak | H03M 13/1575 |
| 2022/0197815 A1* | 6/2022 | Cariello | G06F 12/1009 |
| 2022/0300369 A1* | 9/2022 | Sharon | G06F 11/1044 |

FOREIGN PATENT DOCUMENTS

| | | |
|---|---|---|
| TW | I676985 B | 11/2019 |
| TW | 201947600 | 12/2019 |
| WO | WO 2012/060857 | 5/2012 |

\* cited by examiner

MANAGING ERROR CORRECTION CODING IN MEMORY SYSTEMS

CROSS-REFERENCE TO RELATED APPLICATIONS

This application is a continuation application of and claims the benefit of priority to U.S. application Ser. No. 17/223,545, filed on Apr. 6, 2021, the content of which is hereby incorporated in its entirety by reference.

BACKGROUND

Some memory systems include system controllers and memory devices that communicate with each other through electrical circuit boards. In some cases, the system controllers perform error correction coding for data to or from the memory devices, which causes large data transfer through the electrical circuit boards. This may cause high power consumption and high operation temperature.

SUMMARY

The present disclosure describes systems and techniques for managing error correction coding in memory systems, e.g., solid state drives (SSDs), particularly by implementing error correction code (ECC) circuits in memory devices, e.g., flash memory devices, to reduce data transfer through electrical circuit boards and separate heat sources in the memory systems, which can greatly reduce power consumption and increase heat dissipation.

One aspect of the present disclosure features a memory system including: a system controller configured to communicate with a host device; and a memory device coupled to the system controller. The memory device includes: at least one memory and a memory controller coupled to the at least one memory, the memory controller including an error correction code (ECC) circuit configured to perform error correction coding for data received from at least one of the system controller or the at least one memory.

In some embodiments, the memory controller is coupled to the system controller via a first type of electrical connection, the memory controller is coupled to the at least one memory via a second type of electrical connection, and an impedance of the second type of electrical connection is smaller than an impedance of the first type of electrical connection. The second type of electrical connection can have a smaller operation power consumption than the first type of electrical connection.

In some embodiments, the memory system further includes an electrical connection board. The system controller and the memory device can be respectively arranged on the electrical connection board. The first type of electrical connection can be implemented with a shared bus of the electrical connection board. The second type of electrical connection can be implemented with an internal bus in the memory device.

In some embodiments, the memory system is configured to be a solid-state drive (SSD), and the system controller includes an SSD controller, and the memory device includes a flash memory.

In some embodiments, the system controller includes: a first interface configured to communicate with the host device via a third type of electrical connection according to a first interface protocol, where the impedance of the second type of electrical connection is smaller than an impedance of the third type of electrical connection; and a second interface configured to communicate with the memory controller via the first type of electrical connection according to a second interface protocol.

In some embodiments, the first type of electrical connection is same as the third type of electrical connection. In some embodiments, the first interface protocol includes a bus interface protocol, and the second interface protocol includes a flash interface protocol.

In some embodiments, the memory controller includes: a third interface configured to communicate with the system controller via the first type of electrical connection according to the second interface protocol. The second interface and the third interface can be customized and different from the first interface. The system controller can include a data processor configured to communicate with the memory controller through the second interface and the third interface according to the second interface protocol. The data processor can include the second interface and can be formed as an individual chip in the system controller. The at least one memory and the memory controller can be formed as respective chips that are packaged in the memory device.

In some embodiments, the memory controller is configured to: receive the data from the system controller via the first type of electrical connection; encode the data to obtain encoded data using the ECC circuit, the encoded data having a larger size than the data; and write the encoded data in the at least one memory via the second type of electrical connection.

In some embodiments, the memory controller is configured to: read the data from the at least one memory via the second type of electrical connection; decode the data to obtain decoded data using the ECC circuit, the decoded data having a smaller size than the data; and send the decoded data to the system controller via the first type of electrical connection.

In some embodiments, the memory controller is configured to: read soft bits of the data from the at least one memory via the second type of electrical connection; decode the soft bits of the data to obtain decoded data using the ECC circuit according to a soft decision decoding algorithm, the decoded data having a smaller size than the data; and send the decoded data to the system controller via the first type of electrical connection.

In some embodiments, the ECC circuit in the memory controller is a memory-side ECC circuit. The system controller can include a system-side ECC circuit having a stronger decoding capability than the memory-side ECC circuit in the memory controller, and the memory-side ECC circuit can be configured to decode data according to a weaker decoding algorithm, and the system-side ECC circuit in the system controller is configured to de decode data according to a stronger decoding algorithm.

In some embodiments, the memory-side ECC circuit in the memory controller has a smaller area than the system-side ECC circuit in the system controller.

In some embodiments, the weaker decoding algorithm includes a bit-flipping related algorithm, and the stronger decoding algorithm includes a min-sum related algorithm.

In some embodiments, the memory controller is configured to: in response to determining that the memory-side ECC circuit fails to decode the data according to the weaker decoding algorithm, send the data to the system controller. The system controller is configured to: decode the data using the system-side ECC circuit according to the stronger decoding algorithm; in response to determining that the system-side ECC circuit fails to decode the data according to the stronger decoding algorithm, send a request to the memory controller for reading soft bits of the data from the at least one memory; and in response to receiving the soft bits of the data from the memory controller, decode the soft bits of the data using the system-side ECC circuit according to the stronger decoding algorithm to obtain decoded data, the decoded data having a smaller size than the data. The memory controller is configured to: send the soft bits of the data to the system controller, without decoding the soft bits of the data using the memory-side ECC circuit.

In some embodiments, the memory system includes a plurality of memory devices including the memory device. Each of the plurality of memory devices is coupled to the system controller and includes: a respective memory; and a respective memory controller coupled to the respective memory, the respective memory controller including a corresponding ECC circuit configured to perform corresponding error correction coding for corresponding data received from at least one of the respective memory or the system controller.

In some embodiments, the system controller includes a plurality of data processors, each of the plurality of data processors being configured to communicate with a respective memory device of the plurality of memory devices.

In some embodiments, the corresponding ECC circuit in the respective memory controller of each of the plurality of memory devices is a memory-side ECC circuit, and each of the plurality of data processors includes a system-side ECC circuit that has a stronger decoding capability than the memory-side ECC circuit.

In some embodiments, the memory system further includes a memory access controller configured to control data transfer between the system controller and at least one of the plurality of memory devices.

In some embodiments, the memory system further includes a second memory device coupled to both the system controller and the memory device. The second memory device can have a faster response speed than the memory device.

In some embodiments, the memory device includes a flash memory, and the second memory device includes a Dynamic Random Access Memory (DRAM).

In some embodiments, the system controller includes an internal controller configured to control data transfer between the system controller and the second memory device.

In some embodiments, the at least one memory includes a plurality of memories each coupled to the memory controller, and the ECC circuit is configured to perform error correction coding for corresponding data associated with each of the plurality of memories.

Another aspect of the present disclosure features a memory device including: at least one memory; and a memory controller coupled to the at least one memory. The memory controller includes: a memory interface configured to communicate with a system controller via a first type of electrical connection, where the memory controller is coupled to the at least one memory via a second type of electrical connection that has a smaller impedance than the first type of electrical connection; and an error correction code (ECC) circuit configured to perform error correction coding for data received from at least one of the system controller or the at least one memory based on at least one of a read command or a write command received by the system controller from a host device.

A further aspect of the present disclosure features a method performed by a memory system. The method includes: receiving, by a system controller of the memory system, data from a host device coupled to the system controller; sending, by the system controller, the data to a memory device of the memory system via a first type of electrical connection; encoding, by an error correction code (ECC) circuit in a memory controller of the memory device, the data to obtain encoded data, the encoded data having a larger size than the data; and writing, by the memory controller, the encoded data in at least one memory of the memory device. The memory controller is coupled to the at least one memory via a second type of electrical connection that has a smaller impedance than the first type of electrical connection.

In some embodiments, the method further includes: obtaining, by the memory controller, specified data from the at least one memory via the second type of electrical connection; decoding, by the ECC circuit in the memory controller, the specified data to obtain decoded specified data, the decoded specified data having a smaller size than the specified data; and sending, by the memory controller, the decoded data to the system controller via the first type of electrical connection.

In some embodiments, the method further includes: obtaining, by the memory controller, specified data from the at least one memory via the second type of electrical connection; in response to determining that the ECC circuit in the memory controller fails to decode the specified data, sending, by the memory controller, the specified data to the system controller via the first type of electrical connection; and decoding, by a second ECC circuit in the system controller, the specified data, the second ECC circuit having a stronger decoding capability than the ECC circuit.

In some embodiments, the method further includes: in response to determining that the second ECC circuit fails to decode the specified data, sending, by the system controller, a request to the memory controller for reading soft bits of the specified data from the at least one memory; sending, by the memory controller, the soft bits of the specified data to the system controller, without decoding the soft bits of the specified data using the ECC circuit; and decoding, by the second ECC circuit in the system controller, the soft bits of the specified data to obtain decoded specified data, the decoded specified data having a smaller size than the specified data.

In some embodiments, the method further includes: sending, by the system controller, the decoded specified data to the host device.

Implementations of the above techniques include methods, systems, computer program products and computer-readable media. In one example, a method can be performed by a memory system including a system controller and at least one memory device, and the method can include the above-described actions performed by the memory system, e.g., the actions for managing error correction coding in the memory system. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

Implementations of the present disclosure provide systems, methods, and techniques for managing error correction coding in memory systems, which can reduce power consumption and provide better heat dissipation. For example, by integrating ECC circuits into memory devices, a data transfer volume through electrical connection boards can be greatly reduced, which can reduce power consumption of the memory systems. Moreover, moving at least part of the ECC coding capability from a system controller to a memory device in a memory system can disperse (or separate) heat sources (or power sources) across the memory system and increase heat dissipation in the system controller.

The techniques can be implemented for any type of memory systems or controllers coupled with one or more memory devices. For example, the techniques can be applied in a solid-state drive (SSD) architecture including an SSD controller and one or more flash memory devices. The techniques can be implemented in digital integrated circuit (IC) designs and fabrications.

The techniques can be applied to various types of volatile memory devices or systems or non-volatile memory devices or systems, such as NAND flash memory devices or systems, NOR flash memory devices or systems, resistive random-access memory (RRAM) devices or systems, phase-change random-access memory (PCRAM) devices or systems, among others. The techniques can be applied to two-dimensional (2D) memory devices or systems or three-dimensional (3D) memory devices or systems. The techniques can be applied to various memory types, such as SLC (single-level cell) devices or systems, MLC (multi-level cell) devices like 2-level cell devices or systems, TLC (triple-level cell) devices or systems, QLC (quad-level cell) devices or systems, or PLC (penta-level cell) devices or systems. Additionally or alternatively, the techniques can be applied to various types of devices or systems, such as secure digital (SD) cards, embedded multimedia cards (eMMC), universal flash storages (UFSs), solid-state drives (SSDs), embedded systems, among others.

The details of one or more disclosed implementations are set forth in the accompanying drawings and the description below. Other features, aspects, and advantages will become apparent from the description, the drawings and the claims.

DETAILED DESCRIPTION

Figure 1:
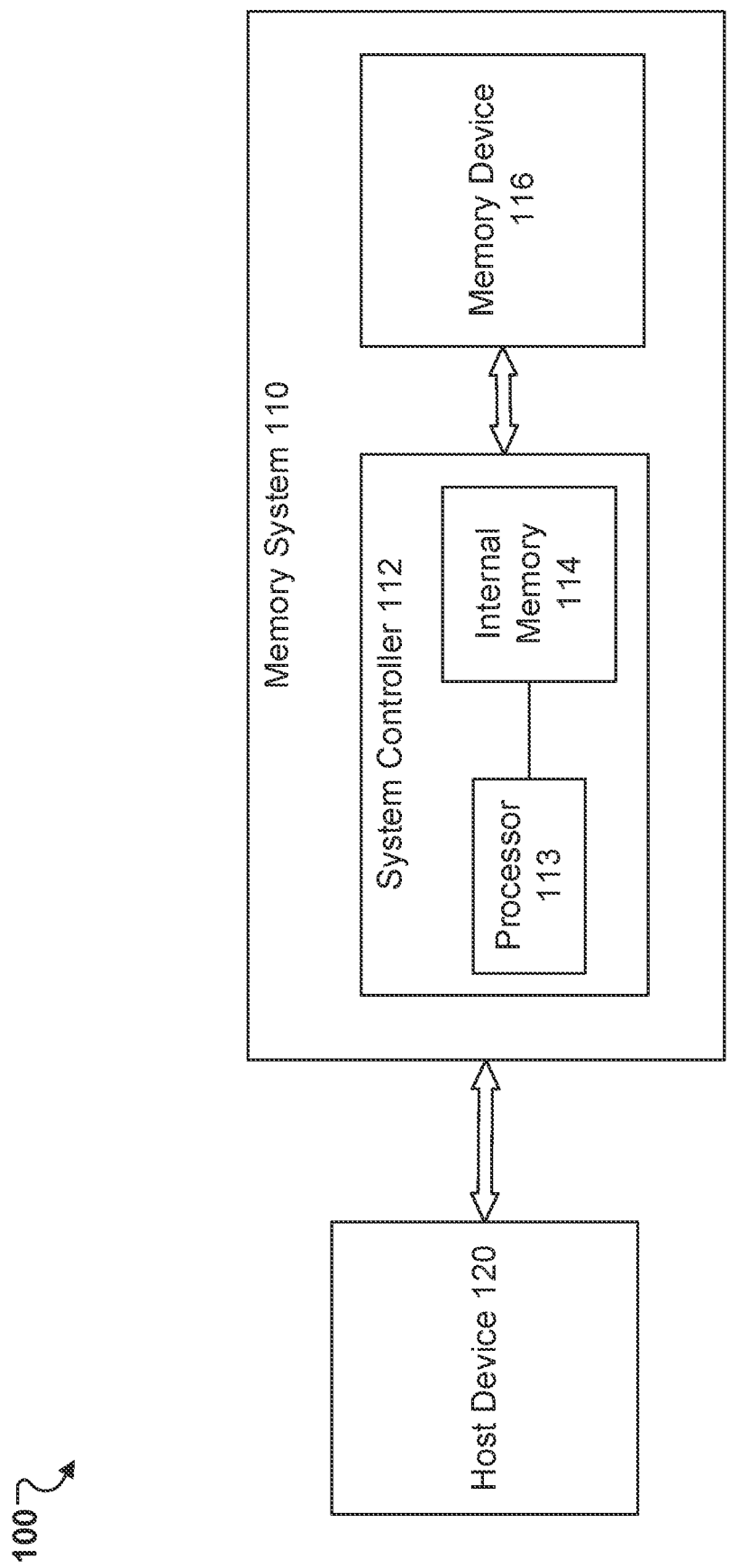
FIG. 1 illustrates an example of a system including a host device and a memory system.

FIG. 1 illustrates an example of a system 100 that includes a memory system 110 and a host device 120. The memory system 110 includes a system controller 112 and at least one memory device 116. The system controller 112 includes a processor 113 and an internal memory 114.

In some implementations, the memory system 110 is a storage system. For example, the memory system 110 can be an embedded multimedia card (eMMC), a secure digital (SD) card, a solid-state drive (SSD), or some other suitable storage system. In some implementations, the memory system 110 is a smart watch, a digital camera or a media player. In some implementations, the memory system 110 is a client device that is coupled to a host device 120. For example, the memory system 110 is an SD card in a digital camera or a media player that is the host device 120.

The system controller 112 is a general-purpose microprocessor, or an application-specified microcontroller. In some implementations, the system controller 112 is a controller for the memory system 110. The following sections describe the various techniques based on implementations in which the system controller 112 is a memory system controller. However, the techniques described in the following sections are also applicable in implementations in which the system controller 112 is another type of controller that is different from a memory system controller.

The processor 113 is configured to execute instructions and process data. The instructions include firmware instructions and/or other program instructions that are stored as firmware code and/or other program code, respectively, in an internal memory 114. The data includes program data corresponding to the firmware and/or other programs executed by the processor, among other suitable data. In some implementations, the processor 113 is a general-purpose microprocessor, or an application-specified microcontroller. The processor 113 can be also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the memory system 110 is an eMMC, an SD card or a smart watch, the internal memory 114 is an SRAM. In some implementations, when the memory system 110 is a digital camera or a media player, the internal memory 114 is DRAM.

In some implementations, the internal memory 114 is a cache memory that is included in the system controller 112, as shown in FIG. 1. The internal memory 114 stores instruction codes, which correspond to the instructions executed by the processor 113, and/or the data that are requested by the processor 113 during runtime.

The system controller 112 transfers the instruction code and/or the data from the memory device 116 to the internal memory 114. In some implementations, the memory device 116 is a non-volatile memory device that is configured for long-term storage of instructions and/or data, e.g., a NAND flash memory device, or some other suitable non-volatile memory device. In implementations where the memory device 116 is a NAND flash memory device, the memory system 110 is a flash memory device, e.g., a flash memory card, and the system controller 112 is a NAND flash controller. In some implementations, when the memory system 110 is an eMMC or an SD card, the memory device 116 is a NAND flash. In some implementations, when the memory system 110 is a digital camera, the memory device 116 is an SD card. In some implementations, when the memory system 110 is a media player, the memory device 116 is a hard disk.

For illustration purposes, the following figures and corresponding descriptions use an SSD as an example memory system, e.g., the memory system 110 of FIG. 1, an SSD controller as an example system controller, e.g., the system controller 112 of FIG. 1, and a flash memory device as an example memory device, e.g., the memory device 116 of FIG. 1.

Figure 2:
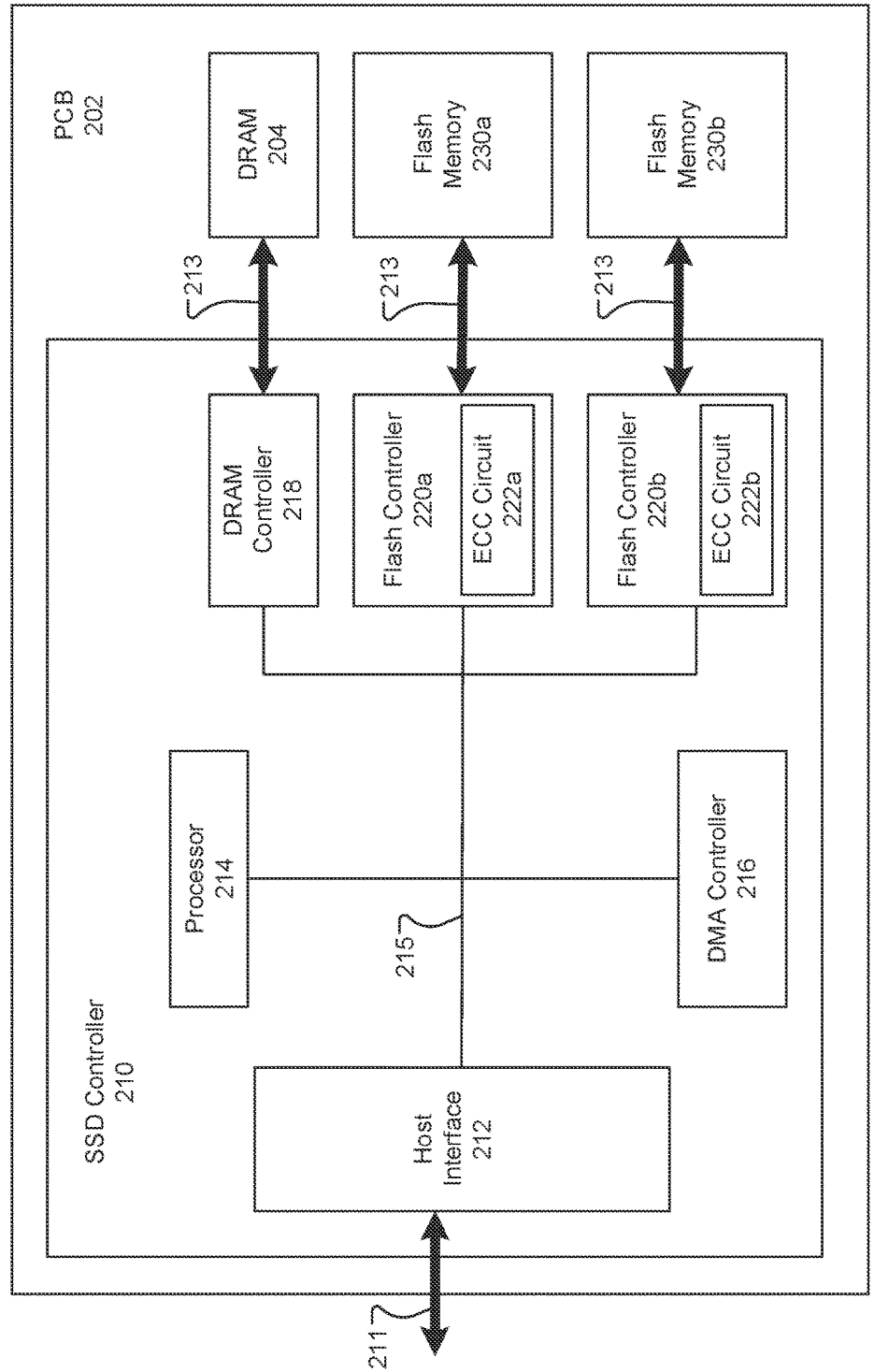
FIG. 2 illustrates an example memory system including a system controller having ECC circuits and memory devices without ECC circuits.

FIG. 2 illustrates an example memory system, e.g., an SSD 200. The SSD 200 can be the memory system 110 of FIG. 1. The SSD 200 includes a system controller, e.g., an SSD controller 210, and multiple memory devices including a DRAM 204 and flash memories 230a, 230b (referred to generally as flash memories 230 or individually as flash memory 230). The DRAM 204 has a faster response speed than the flash memory 230 and can be configured to store cached data for the SSD controller 210 or the flash memories 230.

Each of the memory devices 204, 230 can be the memory device 116 of FIG. 1. Each of the memory devices 204, 230 can be a die or a chip. The memory system 200 can be a multi-chip package formed on an electrical connection board, e.g., a printed circuit board (PCB) 202. The PCB 202 can include a shared bus providing electrical connections 213 between the SSD controller 210 and the memory devices 204, 230, such that the SSD controller 210 can communicate with each of the memory devices 204, 230.

As illustrated in FIG. 2, the SSD controller 210 includes a host interface 212 configured to communicate with a host device, e.g., the host device 120 of FIG. 1, through an electrical connection 211. The electrical connection 211 can be also provided by the shared bus. The electrical connection 211 can be the same as the electrical connection 213. The host interface 212 can communicate with the host device according to an interface protocol, e.g., a bus interface protocol such as a NAND interface protocol. The SSD controller 210 can receive a read command or a write command from the host device through the host interface 212 to thereby read data from at least one of the memory devices 204, 230 or write data to at least one of the memory devices 204, 230.

In some implementations, as illustrated in FIG. 2, the SSD controller 210 includes a processor 214 and multiple controllers for the memory devices. The processor 214 can be the processor 113 of FIG. 1. Each controller is configured for a respective memory device. The memory controllers include a DRAM controller 218 and flash controllers 220a, 220b (referred to generally as flash controllers 220 or individually as flash controller 220). The DRAM controller 218 is configured to communicate with the DRAM 204 and control data transfer between the SSD controller 210 and the DRAM 204. The flash controller 220 is configured to communicate with the flash memory 230 and control data transfer between the SSD controller 210 and the flash memory 230. The SSD controller 210 can also include a memory access controller, e.g., a direct memory access (DMA) controller 216. The DMA controller 216 is configured to control data transfer between the SSD controller 210 and the memory devices 204, 230. For example, the DMA controller 216 can arbitrate data transfer to or from the memory devices 204, 230 according to a criteria, e.g., a priority.

The SSD controller 210 includes an internal bus coupled to components in the SSD controller 210, including the host interface 212, the processor 214, the DMA controller 216, the DRAM controller 218, and the flash controllers 220. Each of the components can be a chip, and the SSD controller 210 can be a multi-chip package that is arranged on the PCB 202. The internal bus provides electrical connections 215 for the components such that the components can communicate with one another through the electrical connections 215. The internal bus in the SSD controller 210 is different from the shared bus on the PCB 202. The electrical connections 215 in the SSD controller 210 can have a lower impedance, e.g., lower resistance or lower capacitance or both, than the electrical connection 211, 213 on the PCB 202. Accordingly, the electrical connection 215 causes less operation power consumption than the electrical connection 211, 213.

In some implementations, as illustrated in FIG. 2, each flash controller 220a, 220b includes an ECC circuit 222a, 222b (referred to generally as ECC circuits 222 or individually as ECC circuit 222). The ECC circuit 222 can include an ECC encoder and an ECC decoder. The ECC circuit 222 can be implemented based on an ECC scheme, e.g., a Reed Solomon code scheme, a Bose-Chaudhuri-Hocquenghem (BCH) code scheme, a low-density parity check (LDPC) code scheme, a Turbo Code scheme, or any combination thereof.

The flash controller 220 can receive data to be stored to a corresponding flash memory 230, e.g., from the host device through the host interface 212. Then the ECC encoder in the flash controller 220 can be configured to generate a codeword, e.g., by encoding the data using an ECC encoding scheme. In some examples, the flash controller 220 receives a K-bit dataword, and the ECC encoder can encode the K-bit dataword to an N-bit codeword, where N=K+P, and P is the number of party bits for the K-bit dataword. The flash controller 220 can then store (e.g., program or write) the N-bit codeword into the corresponding flash memory 230 through the electrical connection 213 on the PCB 202.

The flash controller 220 can also receive encoded data (e.g., a codeword) read from the corresponding flash memory 230 through the electrical connection 213 on the PCB 202, and the ECC decoder in the flash controller 220 can be configured to decode the encoded data to detect and correct, up to an error correction capability of the ECC scheme, any bit errors that may be present in the data. If the ECC decoder cannot correct a threshold count of the bit errors in the encoded data, it indicates that a result of decoding the encoded data fails the ECC decoding test or the ECC decoder fails to decode the encoded data. If the ECC decoder can correct the bit errors in the encoded data, it indicates the encoded data passes the ECC test or the ECC decoder successfully decodes the encoded data, and the encoded data is decoded to become decoded data (e.g., a dataword). The flash controller 220 can then send the decoded data, e.g., to the host device through the host interface 212. In some examples, the flash controller 220 receives an N-bit codeword including P parity bits for K-bit dataword from the corresponding flash memory 230 through the electrical connection 213 on the PCB 202. The ECC decoder in the flash controller 220 can decode the N-bit codeword to obtain the K-bit dataword in the SSD controller 210.

In some implementations, if a result of decoding the encoded data fails the ECC decoding test, the flash controller 220 can perform a soft decision decoding algorithm, e.g., to decode the encoded data with soft bits read from the corresponding flash memory 230. The number of soft bits, e.g., m, determines the number of read operations from the corresponding flash memory 230. For example, for the N-bit codeword, the total number of bits read from the corresponding flash memory 230 can be $N*(1+m)$ bits. That means that a large number of bits is transferred through the electrical connection on the PCB 202, which can cause large power consumption.

In some implementations, the SSD controller 210 operates at a high frequency with a high throughput, e.g., for multi-channel flash memory access, which may cause high power consumption and a high operation temperature for the SSD 200.

Figure 3:
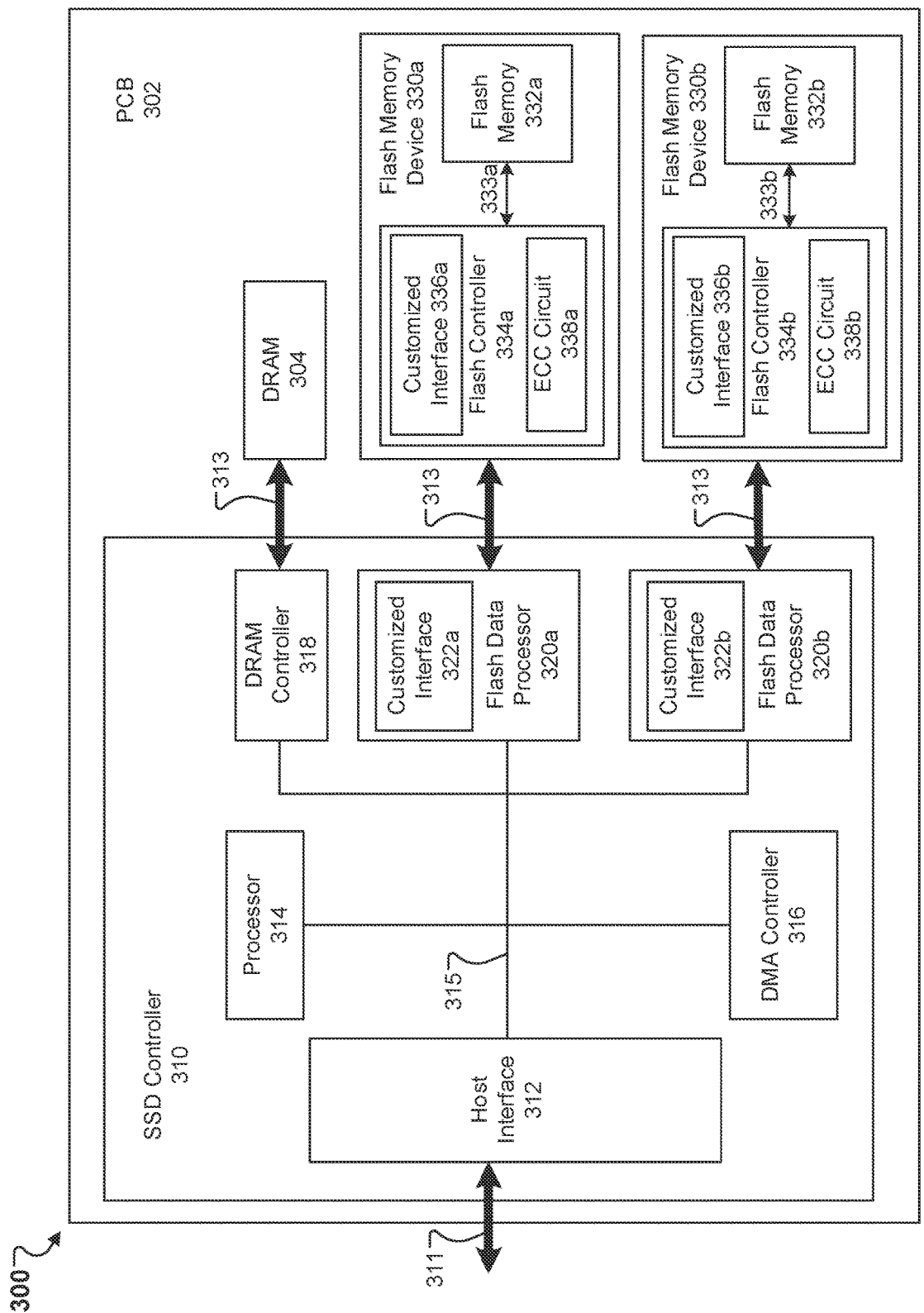
FIG. 3 illustrates an example memory system including a system controller without ECC circuits and memory devices having ECC circuits.

FIG. 3 illustrates an example memory system, e.g., an SSD 300, that can address the above issues of high power consumption and/or high operation temperature, e.g., by removing ECC coding capability from a system controller to memory devices.

Similar to the SSD 200 of FIG. 2, the SSD 300 includes an SSD controller 310 and multiple memory devices including a DRAM 304 (e.g., the DRAM 204 of FIG. 2) and flash memory devices 330a, 330b (referred to generally as flash memories 330 or individually as flash memory 330). The SSD 300 can be the memory system 110 of FIG. 1, the SSD controller 310 can be the system controller 112 of FIG. 1, and the memory device 304, 330 can be the memory device 116 of FIG. 1.

The SSD controller 310 and the memory devices 304, 330 can be arranged on an electrical connection board, e.g., a PCB 302. The PCB 302 can be the PCB 202 of FIG. 2. The PCB 302 can include a shared bus. The SSD controller 310 can communicate with each of the memory devices 304, 330 by an electrical connection 313 provided by the shared bus on the PCB 302. The memory devices 304, 330 can also communicate with one another through the shared bus. For example, the DRAM 304 can communicate with at least one of the flash memories 330 through the shared bus, without through the SSD controller 310.

The SSD controller 310 is configured to execute instructions (e.g., firmware instructions) and control an overall operation of the SSD 300. Similar to the SSD controller 210 of FIG. 2, the SSD controller 310 can include a host interface 312, e.g., the host interface 212 of FIG. 2, that is configured to communicate with a host device, e.g., the host device 120 of FIG. 1, through an electrical connection 311, e.g., the electrical connection 211 of FIG. 2. The electrical connection 311 can be the same as the electrical connection 313 and be provided by the shared bus of the PCB 302. The host interface 312 can communicate with the host device according to an interface protocol, e.g., a bus interface protocol or a NAND interface protocol. The SSD controller 310 can receive a read command or a write command from the host device through the host interface 312 to thereby read data from at least one of the memory devices 304, 330 or write data to at least one of the memory devices 304, 330.

Also, similar to the SSD controller 210 of FIG. 2, the SSD controller 310 includes a processor 314, a DMA controller 316, and a DRAM controller 318. The processor 314 can be the processor 113 of FIG. 1. The DRAM controller 318 is configured to communicate with the DRAM 304 and control data transfer between the SSD controller 310 and the DRAM 304. The DRAM controller 318 can be similar to the DRAM controller 218 of FIG. 2. The DMA controller 316 can be similar to the DMA controller 216 of FIG. 2, and can be configured to control data transfer between the SSD controller 310 and the memory devices 304, 330. For example, the DMA controller 316 can arbitrate data transfer to or from the memory devices 304, 330 according to a criteria, e.g., a priority.

The SSD controller 310 can also include an internal bus coupled to components in the SSD controller 310. Each of the components can be a die or chip, and the SSD controller 310 can be a multi-chip package that is arranged on the PCB 302. The internal bus provides electrical connections 315, e.g., the electrical connection 215 of FIG. 2, for the components such that the components can communicate with one another through the electrical connections 315. The internal bus in the SSD controller 310 is different from the shared bus on the PCB 302. The electrical connections 315 in the SSD controller 310 can have a lower impedance, e.g., lower resistance or lower capacitance or both, than the electrical connection 311, 313 on the PCB 302. Accordingly, the electrical connection 315 causes less operation power consumption than the electrical connection 311, 313.

Different from the SSD 200 of FIG. 2, the SSD 300 removes ECC circuits from the SSD controller 310 and include ECC circuits in the flash memory devices 330. As illustrated in FIG. 3, each flash memory device 330a, 330b includes a flash memory 332a, 332b (referred to generally as flash memories 332 or individually as flash memory 332) and a flash controller 334a, 334b (referred to generally as flash controllers 334 or individually as flash controller 334). The flash memory 332 can be the flash memory 230 of FIG. 2.

Each of the flash memory 332 and the flash controller 334 can be a die or chip, and the flash memory 330b can be a multi-chip package arranged on the PCB 302. The flash memory 332 and the flash controller 334 in the flash memory device 330 can be coupled with each other through an electrical connection 333a, 333b (referred to generally as electrical connections 333 or individually as electrical connection 333) in the flash memory device 330. The electrical connection 333 can be a metal wire or metal ball. An impedance of the electrical connection 333 can be the same as or smaller than an impedance of the electrical connection 315 in the SSD controller 310. The impedance of the electrical connection 333 in the flash memory device 330 can be substantially smaller than the impedance of the electrical connection 313 on the PCB 302. The electrical connection 333 can have a substantially smaller area or size than the electrical connection 313. Thus, a same amount of data transfer through the electrical connection 333 in the flash memory device 330 can cause less power consumption and heat than through the electrical connection 313 on the PCB 302.

Each flash controller 334a, 334b includes a customized interface 336a, 336b (referred to generally as customized interfaces 336 or individually as customized interface 336) and an ECC circuit 338a, 338b (referred to generally as ECC circuits 338 or individually as ECC circuit 338). The customized interface 336 is configured to enable the flash controller 334 or the flash memory device 330 to communicate with the SSD controller 310 and to transfer data between the flash memory device 330 or the flash memory 332 and the SSD controller 310. The ECC circuit 338 is configured to calculate ECC bits for data received from at least one of the SSD controller 310 or the flash memory 332. The ECC circuit 338 can be similar to the ECC circuit 222 of FIG. 2. In some implementations, the ECC circuit 338 includes an ECC encoder and an ECC decoder. The ECC circuit 338 can be implemented based on an ECC scheme, e.g., a Reed Solomon code scheme, a Bose-Chaudhuri-Hocquenghem (BCH) code scheme, a low-density parity check (LDPC) code scheme, a Turbo Code scheme, or any combination thereof. As discussed with further details below, the ECC decoder, e.g., an LDPC decoder, can perform a hard-decision decoding or a soft-decision decoding or both, e.g., based on input data log-likelihood ratio (LLR) reliability.

For each flash memory device 330a, 330b, the SSD controller 310 includes a respective flash data processor 320a, 320b (referred to generally as flash data processors 320 or individually as flash data processor 320). Each flash data processor 320 can be an individual die or chip packaged in the SSD controller 310. The flash data processor 320 is different from the flash controller 220 of FIG. 2 and does not include an ECC circuit. The flash data processor 320 is configured to buffer data and/or process data to or from a corresponding flash memory device 330. For example, the flash data processor 320 can perform one or more operations including data encryption, data randomization, and data scrambling. Each flash data processor 320 can include a customized interface 322a, 322b (referred to generally as customized interfaces 322 or individually as customized interface 322). The customized interface 322 in the flash data processor 320 corresponds to the customized interface 336 in the flash controller 334 and is configured to transfer data between the flash data processor 320 or the SSD controller 310 and the flash controller 334 or the flash memory device 330.

The customized interface 322 in the SSD controller 310 and the customized interface 336 in the flash memory device 330 can communicate with each other according to an interface protocol. The interface protocol can be implemented in any suitable format and with any suitable pin number. In some examples, the interface protocol can be same as a flash interface protocol, e.g., a NAND flash interface protocol. In some examples, a number of pins in the interface protocol can be smaller than that of the flash interface protocol. In some examples, the interface protocol can a high speed communication protocol, e.g., a communication protocol with Serializer/Deserializer (SerDes).

Figure 4:
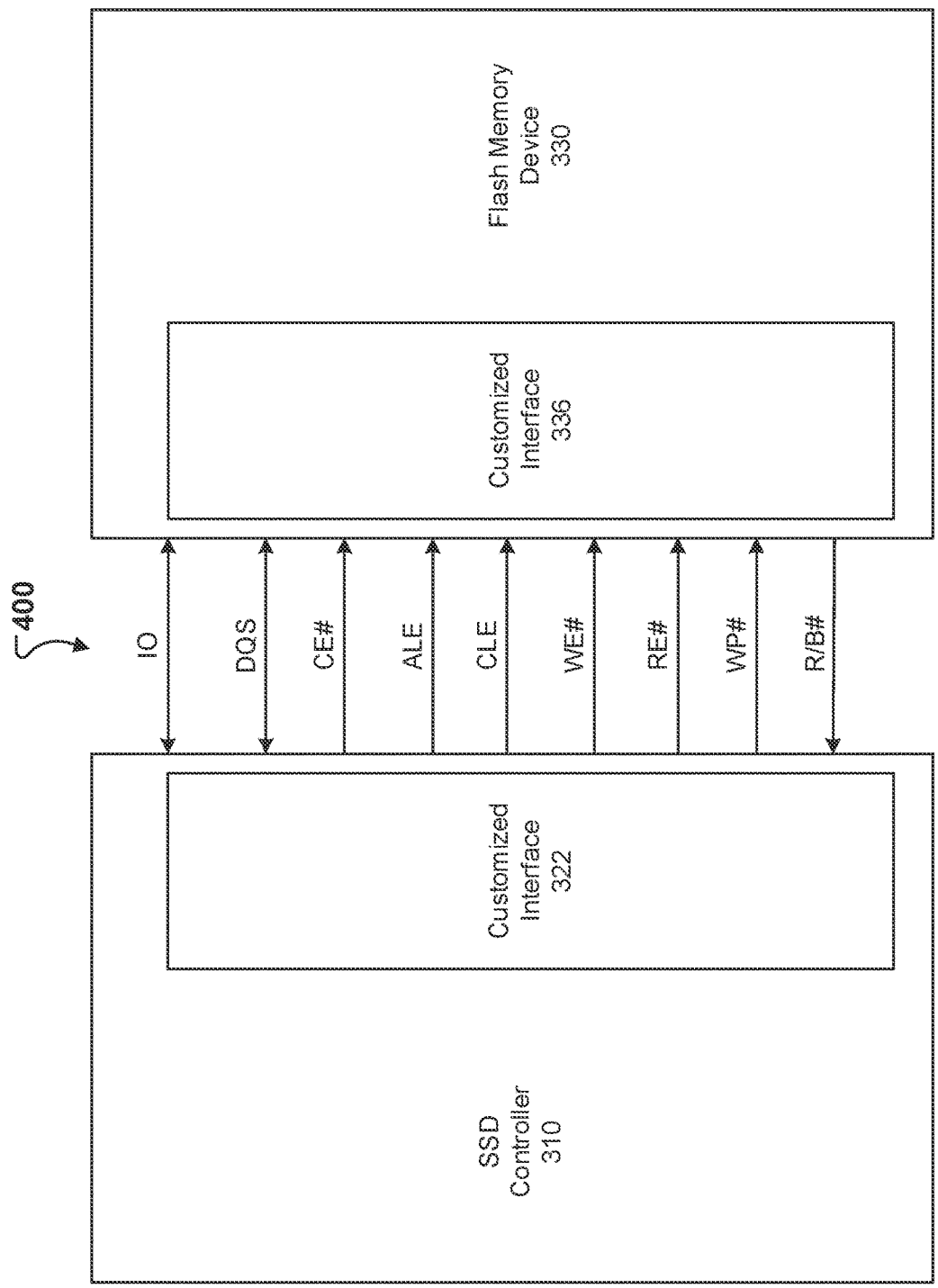
FIG. 4 illustrates an example interface protocol for customized interfaces of the system controller and the memory devices of FIG. 3.

FIG. 4 illustrates an example interface protocol 400 for the customized interfaces 322, 336 of the SSD controller 310 and the flash memory device 330 of FIG. 3. The interface protocol 400 can have at least one of pins including IO pin for data input/output (I/O) port, DQS pin for data strobe, e.g., for double data rate (DDR) mode, CE# pin for chip enable, ALE pin for address latch enable, CLE pin for command latch enable, WE# pin for write enable, RE# pin for read enable, WP# pin for write protect, and R/B# pin for ready/busy status. Each of the customized interfaces 322, 336 can have the same types of pins that are coupled with each other through the electrical connection 313 on the PCB 302.

Figure 5:
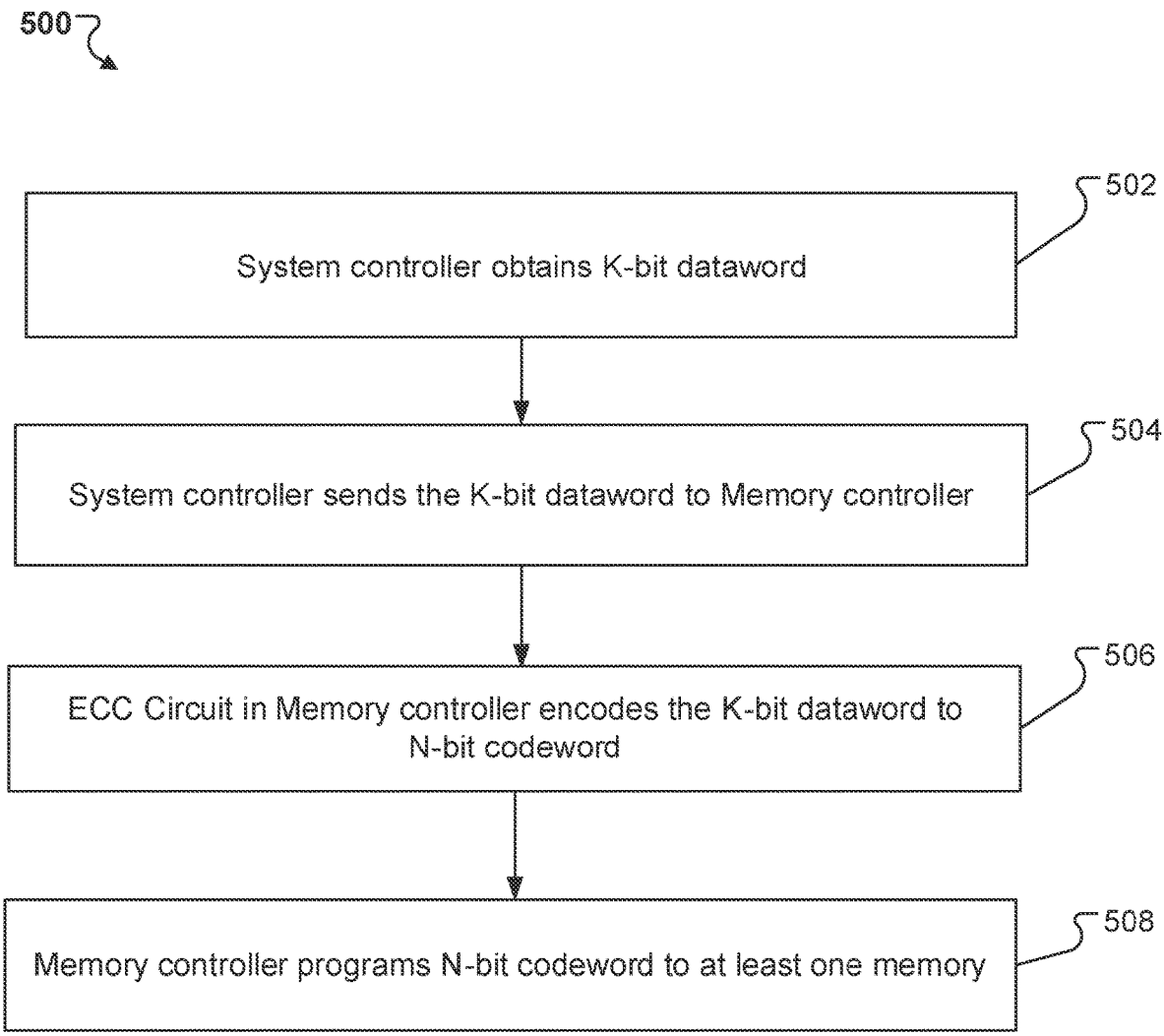
FIG. 5 illustrates an example of a process for encoding data using an ECC circuit in a memory controller after receiving the data from a system controller.
Figure 6:
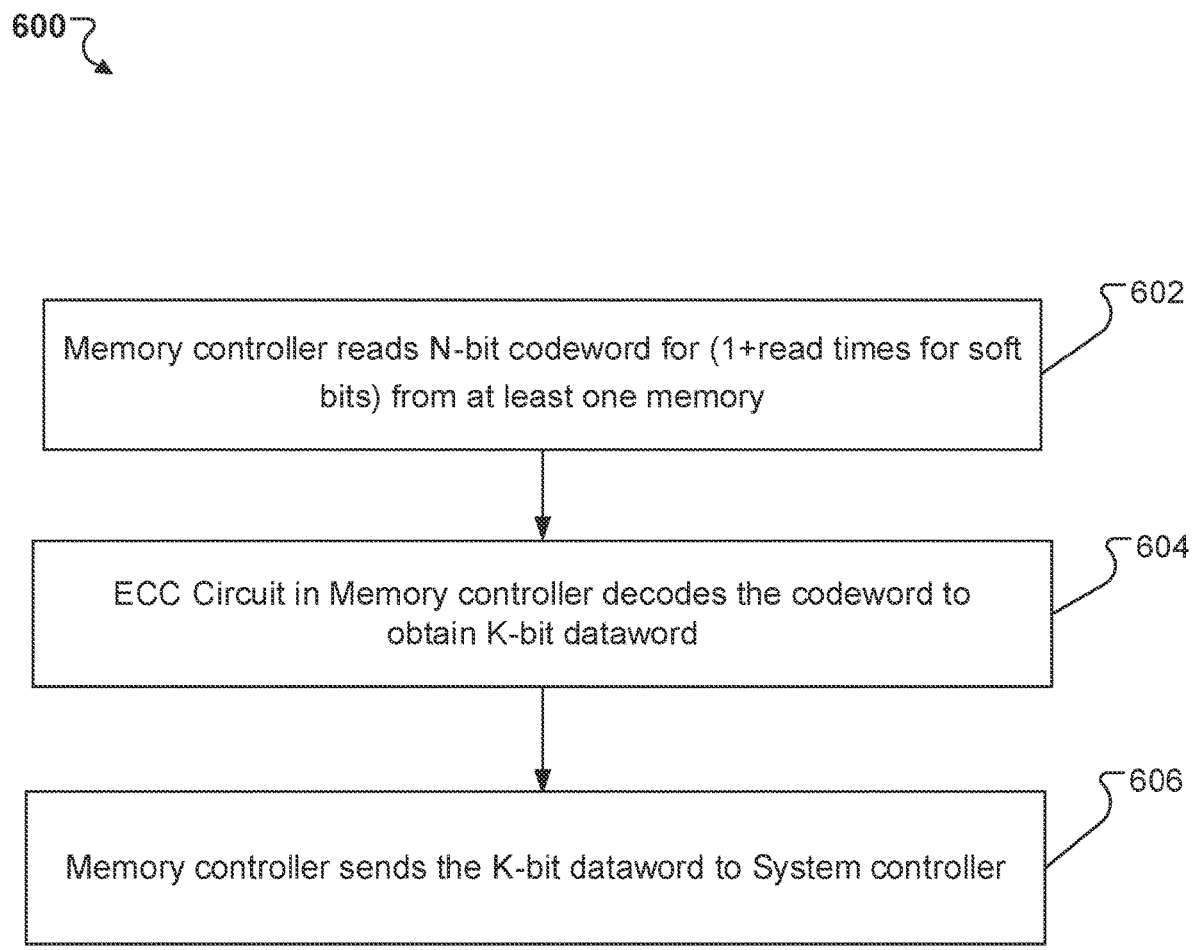
FIG. 6 illustrates an example of a process for decoding data using an ECC circuit in a memory controller before sending decoded data to a system controller.

Referring back to FIG. 3, different from the SSD 200 of FIG. 2 that performs error correction coding in the SSD controller 210, the SSD 300 is configured to perform ECC error correction coding in the flash memory device 330, as illustrated with further details in FIGS. 5 and 6, which can reduce data transfer volume through the PCB 302, e.g., through the electrical connection 313.

FIG. 5 illustrates an example of a process 500 performed by a memory system, e.g., the SSD 300 of FIG. 3. In the process 500, the memory system encodes data using an ECC circuit (e.g., the ECC circuit 338 of FIG. 3) in a memory controller (e.g., the flash controller 334 of FIG. 3) of a memory device (e.g., the flash memory device 330 of FIG. 3) after receiving the data from a system controller (e.g., the SSD controller 310 of FIG. 3).

At 502, the system controller obtains K-bit dataword. The K-bit dataword can be obtained from a host device, e.g., the host device 120 of FIG. 1, through a host interface, e.g., the host interface 312 of FIG. 3. The host device can send a write command for storing the K-bit dataword in the memory device. The write command can include logic addresses for storing the K-bit dataword. The system controller can include a processor, e.g., the processor 314 of FIG. 3, configured to process the write command to determine corresponding physical addresses that are mapped with the logic addresses. The system controller can also include a data processor, e.g., the flash data processor 320 of FIG. 3, configured to buffer the K-bit dataword and/or process the K-bit dataword, e.g., by performing data encryption, data randomization, and data scrambling. The system controller can send the K-bit dataword to the memory device based on the determined physical addresses associated with the write command.

At 504, the system controller sends the K-bit dataword to the memory controller in the memory device through a first type of electrical connection, e.g., the electrical connection 313 on the PCB 302 of FIG. 3. The system controller and the memory controller can communicate through customized interfaces, e.g., the customized interfaces 322 and 336, according to an interface protocol, e.g., the interface protocol 400 of FIG. 4.

At 506, the ECC circuit in the memory controller encodes the K-bit dataword to obtain an N-bit codeword, where N=K+P, and P is the number of party bits for the K-bit dataword.

At 508, the memory controller programs (or writes) the N-bit codeword to at least one memory in the memory device, e.g., the flash memory 332 of FIG. 3, through a second type of electrical connection, e.g., the electrical connection 333 in the flash memory device 330 of FIG. 3. An impedance of the second type of electrical connection can be substantially smaller than an impedance of the first type of electrical connection. Thus, in operation, the second type of electrical connection causes a substantially lower power consumption and/or heat than the first type of electrical connection.

In the process 500, the ECC encoding is after data transfer through the first type of electrical connection, where only K-bit dataword is transferred from the system controller to the memory device through the first type of electrical connection. In contrast, in the SSD 200 of FIG. 2, the ECC encoding is before the data transfer through the first type of electrical connection, where N-bit codeword is transferred from the system controller to the memory device through the first type of electrical connection. For example, if the ECC encoding is implemented with an LDPC encoding scheme, a code rate K/N can be identical to 0.9, which means that 10% data transfer through the first type of electrical connection can be reduced. Thus, compared to the SSD 200 of FIG. 2, the SSD 300 of FIG. 3 enables to reduce data transfer volume through the first type of electrical connection, thereby reducing power consumption. Further, moving the ECC circuit from the system controller to the memory device can reduce power sources in the memory controller, which can increase heat dissipation and reduce an operation temperature.

Referring back to FIG. 3, the ECC decoder in the ECC circuit 338 can be an LDPC decoder configured to perform a hard-decision decoding algorithm or a soft-decision decoding algorithm or both, e.g., based on input data log-likelihood ratio (LLR) reliability. The LLR reliability can be associated with threshold voltage changes of stored bits, e.g., due to read disturbance or any other memory reliability effects.

In the hard-decision decoding algorithm, the ECC decoder is configured to assign an LLR for each input bit before decoding. The sign (+ or −) of the LLR is decided by the hard bit value (1 or 0), and the value of the LLR means a reliability level. For example, as shown in Table 1 below, data bit 1 maps to −7 for LLR, and data bit 0 maps to +7 for LLR.

TABLE 1

Hard-decision decoding

| Hard Bit | 1 | 0 |
|---|---|---|
| LLR | −7 | +7 |

In the soft-decision decoding algorithm, the ECC decoder is configured to assign one or more LLR options, e.g., 4 LLR options, for each data bit before decoding. With more LLR options, the correction ability of the ECC decoder can be improved.

TABLE 2

1-bit soft-decision decoding

| Hard bit | 1 | 1 | 0 | 0 |
|---|---|---|---|---|
| Soft bit | 1 | 0 | 0 | 1 |
| LLR | −5 | −2 | +2 | +5 |

For example, as show in Table 2, a hard bit corresponds to 4 LLR options. If the hard bit has a value of 1, the hard bit corresponds to two soft bits 1 and 0 each associated with a respective LLR option −5 and −2. If the hard bit has a value of 0, the hard bit corresponds to two soft bits 0 and 1 each associated with a respective LLR option +2 and +5. Soft bit 0 means a higher error rate (thus a lower reliability level such as −2 or +2), and soft bit 1 means a lower error rate (thus a higher reliability level such as −5 or +5). Thus, to decode each data bit in a codeword to be 1 or 0, the data bit may be read 4 times from the memory based on the number of LLR options (or the number of soft bits corresponding to the data bit), e.g., with a series of sequential read voltages, which can improve the correction ability of the ECC decoder. Each data bit in the codeword has the same number of LLR options or soft bits.

In operation, the flash controller 334 receives a codeword (e.g., encoded data) read from the flash memory 332 through the electrical connection 333 in the flash memory device 330. The ECC decoder in the ECC circuit 338 of the flash controller 334 is configured to decode the codeword to detect and correct, up to an error correction capability of the ECC scheme, any bit errors that may be present in the codeword. If the ECC decoder cannot correct a threshold count of the bit errors in the codeword, it indicates that decoding the codeword fails the ECC decoding test or the ECC decoder fails to decode the codeword. If the ECC decoder can correct the bit errors in the codeword, it indicates the codeword passes the ECC decoding test, and the codeword is decoded to become decoded data (e.g., a dataword). The flash controller 334 can then send the decoded data to the SSD controller 310 through the electrical connection 313 on the PCB 302.

If the codeword fails the ECC decoding test, the flash controller 334 can perform the soft decision decoding algorithm, e.g., to decode soft bits of the codeword read from the flash memory 332. The number of soft bits, e.g., m, for each data bit in the codeword determines the number of read operations from the flash memory 332. For example, for the N-bit codeword, the number of bits read from the flash memory 332 can be N*m bits according to the soft decision decoding algorithm. Together with the number of bits read in the hard decision decoding algorithm, the total number of bits read from the flash memory 332 can be N*(1+m) bits to the flash controller 334 in the flash memory device 330.

FIG. 6 illustrates an example of a process 600 performed by a memory system, e.g., the SSD 300 of FIG. 3. In the process 600, the memory system decodes data using an ECC circuit (e.g., the ECC circuit 338 of FIG. 3) in a memory controller (e.g., the flash controller 334 of FIG. 3) of a memory device (e.g., the flash memory device 330 of FIG. 3) before sending the data to a system controller (e.g., the SSD controller 310 of FIG. 3). The ECC circuit is configured to perform the decoding according to a hard decision decoding algorithm and a soft decision decoding algorithm as described above.

At 602, the memory controller reads an N-bit codeword from at least one memory in the memory device, e.g., the flash memory 332 of FIG. 3, for (1+m) times for the hard decision decoding algorithm and the soft decision decoding algorithm, where m represents a number of soft bits or LLR options for each bit in the N-bit codeword. That is, there is a total number of N*(1+m) bits transferred from the memory to the memory controller through an internal electrical connection in the memory device, e.g., the electrical connection 333 in the flash memory device 330 of FIG. 3.

At 604, the ECC circuit in the memory controller decodes the N-bit codeword to obtain K-bit dataword, where N=K+P, and P is the parity bits for the K-bit dataword.

At 606, the memory controller sends the K-bit dataword to the system controller through an external electrical connection between the system controller and the memory device, e.g., the electrical connection 313 on the PCB 302 of FIG. 3. The external electrical connection between the system controller and the memory device has a substantially large impedance than the internal electrical connection in the memory device.

In the process 600, the ECC decoding is before data transfer through the external electrical connection, where only K-bit dataword (decoded data) is transferred from the memory device to the system controller through the external electrical connection. In contrast, in the SSD 200 of FIG. 2, as discussed above, the ECC decoding is after the data transfer through the external electrical connection, where (K+P)(1+m) bits are transferred from the memory device to the system controller through the external electrical connection. Thus, compared to the SSD 200 of FIG. 2, the SSD 300 of FIG. 3 enables to reduce data transfer volume through the external electrical connection, thereby greatly reducing power consumption of the memory system or the system controller. Particularly, for multi-channel memory access, the system controller operates at a high frequency with a high throughput, and the SSD 300 can greatly reduce power consumption and increase heat dissipation, compared to the SSD 200.

A higher ECC coding capability may require a larger ECC circuit area, which may affect packaging the ECC circuit in the memory device. In some implementations, the memory system can separate the ECC coding capability between the system controller and the memory controller in the memory device. In such a way, the ECC circuit in the memory device can be smaller, which can be beneficial for packaging the memory device. For example, the system controller can have a stronger processing power than the memory device. The system controller can include a stronger ECC circuit configured for a high error bit count frame, and the memory controller in the memory device can include a weaker ECC circuit configured for a lower error bit count frame.

Figure 7:
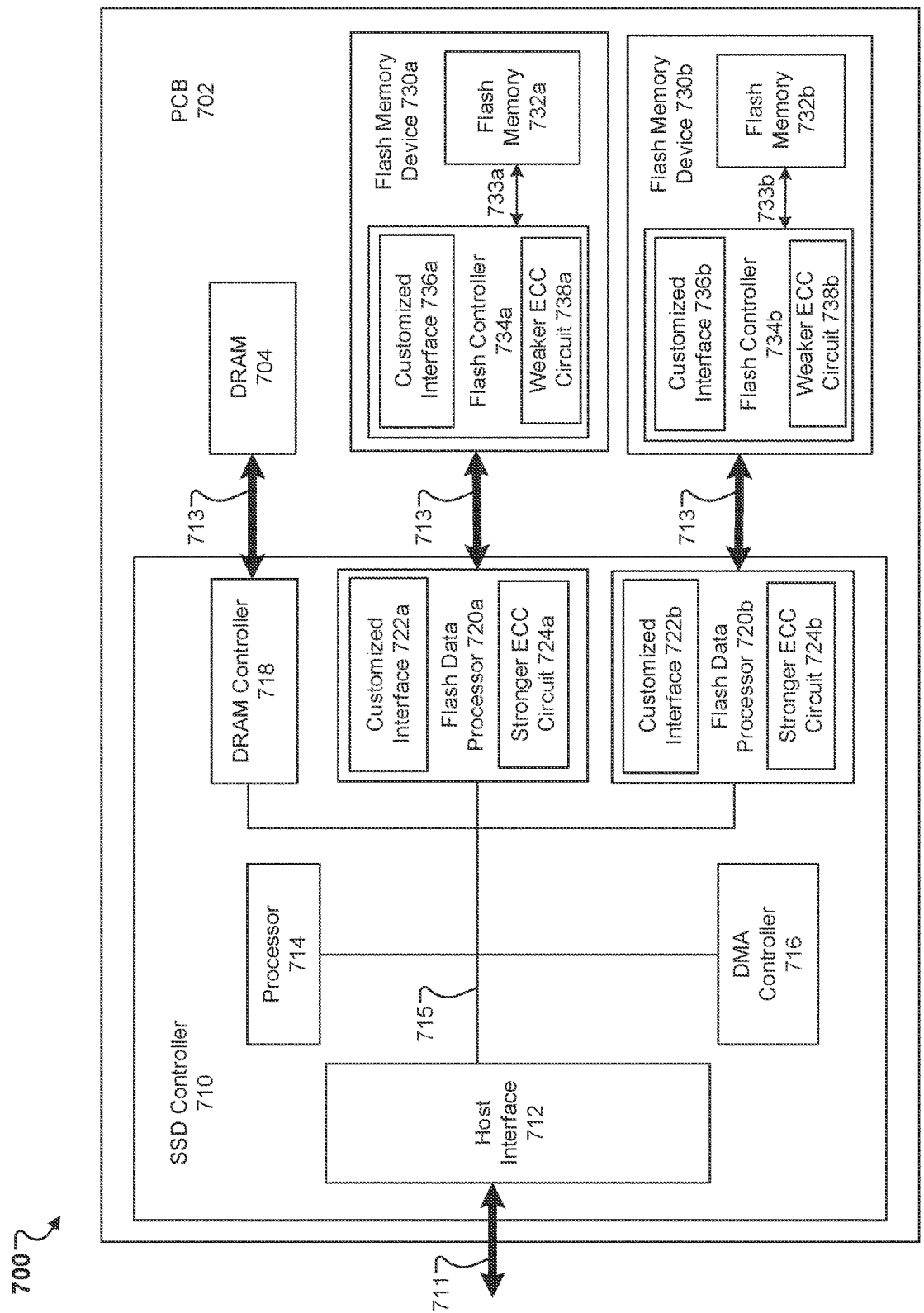
FIG. 7 illustrates an example memory system including a system controller having stronger ECC circuits and memory devices having weaker ECC circuits.

FIG. 7 illustrates an example memory system 700 including a system controller having stronger ECC circuits and memory devices having weaker ECC circuits. The system controller, e.g., an SSD controller 710, and the memory devices, e.g., a DRAM 704 and flash memory devices 730a, 730 (referred to generally as flash memories 730 or individually as flash memory 730). The SSD 700 can be the memory system 110 of FIG. 1, the SSD controller 710 can be the system controller 112 of FIG. 1, and the memory device 704, 730 can be the memory device 116 of FIG. 1. Similar to the SSD 300 of FIG. 3, the SSD controller 710 and the memory devices 704, 730 can be arranged on an electrical connection board, e.g., a PCB 702. The PCB 702 can be the PCB 302 of FIG. 3. The PCB 702 can include a shared bus. The SSD controller 710 can communicate with each of the memory devices 704, 730 by an electrical connection 713 provided by the shared bus on the PCB 702.

Similar to the SSD controller 310 of FIG. 3, the SSD controller 710 can include a host interface 712, e.g., the host interface 312 of FIG. 3, that is configured to communicate with a host device, e.g., the host device 120 of FIG. 1, through an electrical connection 711, e.g., the electrical connection 311 of FIG. 3. The electrical connection 711 can be the same as the electrical connection 713 and be provided by the shared bus of the PCB 702. The host interface 712 can communicate with the host device according to an interface protocol, e.g., a bus interface protocol such as a NAND interface protocol.

Also similar to the SSD controller 310 of FIG. 3, the SSD controller 710 includes a processor 714, a DMA controller 716, and a DRAM controller 718. The processor 714 can be the processor 113 of FIG. 1. The DRAM controller 718 is configured to communicate with the DRAM 704 and control data transfer between the SSD controller 710 and the DRAM 704. The DRAM controller 718 can be the DRAM controller 318 of FIG. 3. The DMA controller 716 can be configured to control data transfer between the SSD controller 710 and the memory devices 704, 730. For example, the DMA controller 716 can arbitrate data transfer to or from the memory devices 704, 730 according to a criteria, e.g., a priority.

The SSD controller 710 can also include an internal bus coupled to components in the SSD controller 710. Each of the components can be a chip, and the SSD controller 710 can be a multi-chip package that is arranged on the PCB 702. The internal bus provides electrical connections 715, e.g., the electrical connection 315 of FIG. 3, for the components such that the components can communicate with one another through the electrical connections 715. The internal bus in the SSD controller 710 is different from the shared bus on the PCB 702. The electrical connections 715 in the SSD controller 710 can have a lower impedance, e.g., lower resistance or lower capacitance or both, than the electrical connection 711, 713 on the PCB 702. Accordingly, the electrical connection 715 causes less operation power consumption than the electrical connection 711, 713.

As illustrated in FIG. 7, each flash memory device 730a, 730b includes a flash memory 732a, 732b (referred to generally as flash memories 732 or individually as flash memory 732) and a flash controller 734b (referred to generally as flash controllers 734 or individually as flash controller 734). The flash memory 732 can be the flash memory 332 of FIG. 3 or the flash memory 230 of FIG. 2.

Each of the flash memory 732 and the flash controller 734 can be a die or chip, and the flash memory device 730 can be a multi-chip package arranged on the PCB 702. The flash memory 732 and the flash controller 734 in the flash memory device 730 can be coupled with each other through an electrical connection 733a, 733b (referred to generally as electrical connections 733 or individually as electrical connection 733) in the flash memory device 730. The electrical connection 733 can be the electrical connection 333 of FIG. 3. An impedance of the electrical connection 733 can be the same as or smaller than an impedance of the electrical connection 715 in the SSD controller 710. The impedance of the electrical connection 733 in the flash memory device 730 can be substantially smaller than the impedance of the electrical connection 713 on the PCB 702. Thus, a same amount of data transfer through the electrical connection 733 in the flash memory device 730 can cause less power consumption and heat than through the electrical connection 713 on the PCB 702.

Different from the SSD 300 of FIG. 3, the SSD 700 include ECC circuits in both the SSD controller 710 and the flash controllers 734 in the flash memory devices 730. The flash controller 734 can include a weaker ECC circuit for performing a hard decision decoding algorithm for a low error bit count frame, and the SSD controller 710 can include a stronger ECC circuit for performing a hard decision decoding algorithm and/or a soft decision decoding algorithm for a high error bit count frame.

For example, the weaker ECC circuit can perform a weaker decoding algorithm, e.g., a bit-flipping related algorithm. The stronger ECC circuit can perform a stronger decoding algorithm, e.g., a min-sum related algorithm. The weaker ECC circuit can have a smaller area than the stronger ECC circuit. Table 3 shows an example of characteristics of an ECC circuit (e.g., a 4 KB LDPC based circuit) implementing the min-sum related algorithm and the bit-flipping related algorithm. It is shown that, for hard-decision decoding, the bit-flipping related algorithm can only achieve an FER of $10^{-3}$ at 200 error bit count per 4 KB frame, while the min-sum algorithm can achieve an FER of $10^{-8}$ at 240 bits per 4 KB frame. Moreover, the min-sim algorithm can perform 1-bit soft-decision decoding to achieve an FER of $10^{-8}$ at 480 bits per 4 KB frame. The ECC circuit implementing the bit-flipping related algorithm can have an area 5 times smaller than that of the ECC circuit implementing the min-sum related algorithm.

TABLE 3

ECC circuit characteristics with different algorithms

| 4KB LDPC | Min-sum related algorithm | Bit-flipping related algorithm |
|---|---|---|
| Correction ability Frame error rate (FER) = uncorrectable frame/total frame | Hard-decision decoding: 240 bits @ FER <$10^{-8}$ 1-bit soft-decision decoding: 480 bits @ FER <$10^{-8}$ | Only Hard-decision decoding: 200 bits @ FER <$10^{-3}$ |
| Area | A | <=A/5 |

As illustrated in FIG. 7, each flash controller 734a, 734b includes a customized interface 736a, 736b (referred to generally as customized interfaces 736 or individually as customized interface 736) and a weaker ECC circuit 738a, 738b (referred to generally as weaker ECC circuits 738 or individually as weaker ECC circuit 738). The customized interface 736 is configured to enable the flash controller 734 or the flash memory device 730 to communicate with the SSD controller 710 and to transfer data between the flash memory device 730 or the flash memory 732 and the SSD controller 710. The weaker ECC circuit 738 is configured to calculate ECC bits for data received from at least one of the SSD controller 710 or the flash memory 732. The weaker ECC circuit 738 includes an ECC encoder and an ECC decoder. The weaker ECC circuit 338 can be implemented based on an ECC scheme, e.g., a Reed Solomon code scheme, a Bose-Chaudhuri-Hocquenghem (BCH) code scheme, a low-density parity check (LDPC) code scheme, a Turbo Code scheme, or any combination thereof. As discussed above, the weaker ECC circuit 738 can perform a weaker decoding algorithm, e.g., a bit-flipping related algorithm, that only performs a hard decision decoding. In such a way, the weaker ECC circuit 738 can have a small area size.

Similar to the SSD controller 310 of FIG. 3, for each flash memory device 730a, 730b, the SSD controller 710 includes a respective flash data processor 720a, 720b (referred to generally as flash data processors 720 or individually as flash data processor 720). Each flash data processor 720 can include a customized interface 722a, 722b (referred to generally as customized interfaces 722 or individually as customized interface 722). The customized interface 722 in the flash data processor 720 corresponds to the customized interface 736 in the flash controller 734 and is configured to transfer data between the flash data processor 720 or the SSD controller 710 and the flash controller 734 or the flash memory device 730. The customized interface 322 in the SSD controller 310 and the customized interface 336 in the flash memory device 330 can communicate with each other according to an interface protocol, e.g., the interface protocol 400 of FIG. 4. The interface protocol can be implemented in any suitable format and with any suitable pin number. In some examples, the interface protocol can be same as a flash interface protocol, e.g., a NAND flash interface protocol. In some examples, the interface protocol can have a pin number less than that of the flash interface protocol. In some examples, the interface protocol can a high speed communication protocol, e.g., with a communication protocol with Serializer/Deserializer (SerDes).

Different from the SSD controller 310 of FIG. 3, the SSD controller 710 includes a stronger ECC circuit 724a, 724b (referred to generally as stronger ECC circuits 724 or individually as stronger ECC circuit 724) in each flash data processor 720a, 720b for a corresponding flash memory device 730a, 730b. Besides buffering data and/or processing data to or from the flash memory device 730, the flash data processor 720 can also perform error correction coding using the stronger ECC circuit 724. The flash data processor 720 can be implemented as a die or a chip that is packaged in the SSD controller 710.

In some implementations, the stronger ECC circuit 724 includes an ECC encoder and an ECC decoder. In some implementations, the stronger ECC circuit 724 can only include an ECC decoder. The stronger ECC circuit 724 can be implemented based on an ECC scheme, e.g., a Reed Solomon code scheme, a Bose-Chaudhuri-Hocquenghem (BCH) code scheme, a low-density parity check (LDPC) code scheme, a Turbo Code scheme, or any combination thereof. As discussed above, the stronger ECC circuit 724 can perform a stronger decoding algorithm, e.g., a min-sum related algorithm, that can perform both hard decision decoding and soft decision decoding. The stronger ECC circuit 724 can perform the hard-decision decoding or the soft-decision decoding or both, e.g., based on input data log-likelihood ratio (LLR) reliability.

Figure 8:
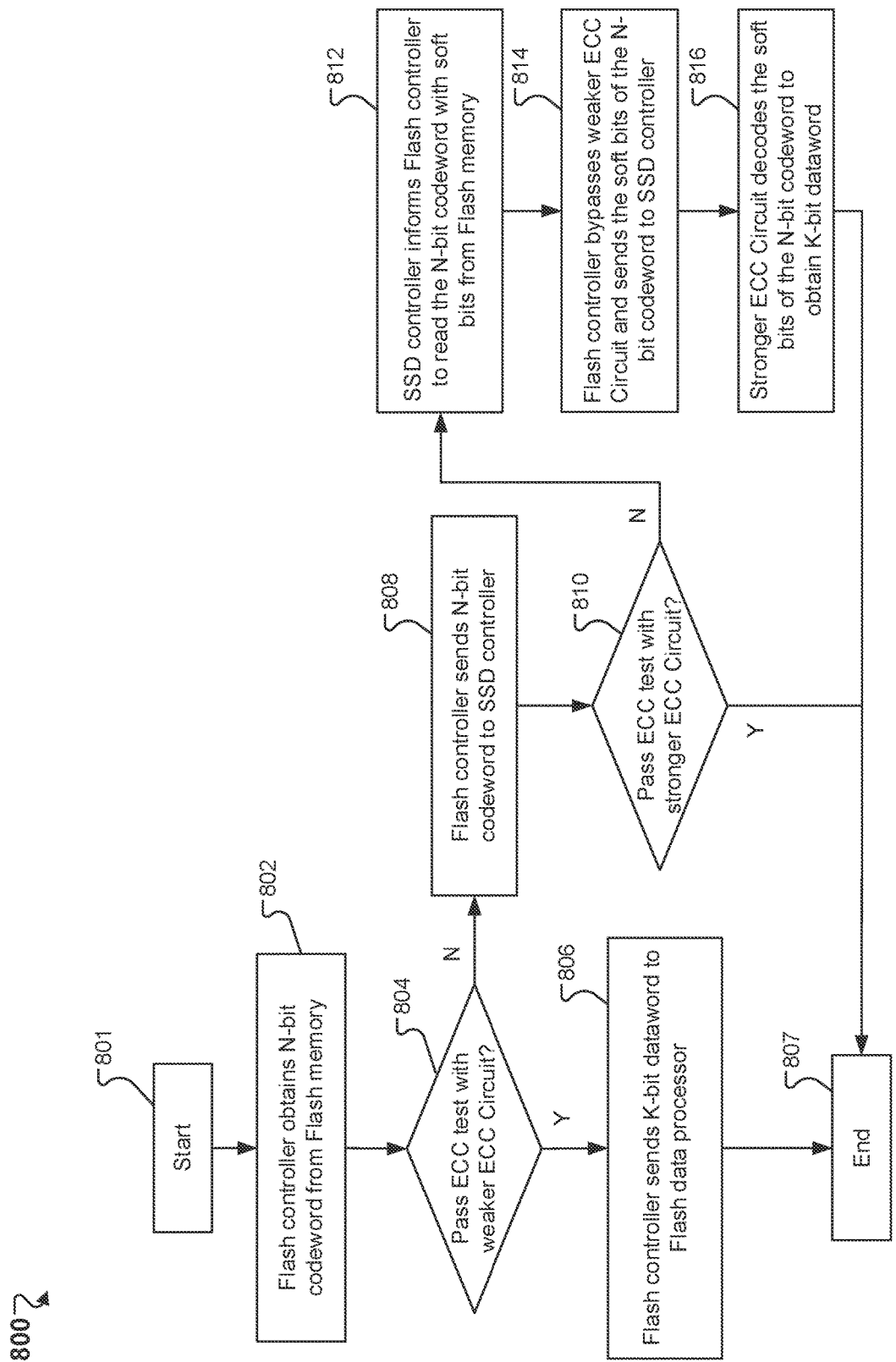
FIG. 8 illustrates an example of a process for decoding data by the memory system of FIG. 7.

FIG. 8 illustrates an example of a process 800 for decoding data by the memory system 700 of FIG. 7. The process 800 starts at 801, e.g., by receiving a read command from the host device through the host interface 711. The read command indicates to read an N-bit codeword from at least one flash memory 732.

At 802, the flash controller 734 obtains (e.g., reads) the N-bit codeword from the flash memory 732 through the internal electrical connection 733 in the flash memory device 730. The weaker ECC circuit 738 then decodes the N-bit codeword according to a weaker decoding algorithm, e.g., the bit-flipping related algorithm.

At 804, the flash controller 734 determines whether a result of decoding the N-bit codeword passes the ECC test with the weaker ECC circuit 738 or the weaker ECC circuit 738 fails to decode the N-bit codeword. The determination can include determining whether error bits in the N-bit codeword can be corrected by parity bits in the N-bit codeword by the weaker ECC circuit 738.

If the flash controller 734 determines that the N-bit codeword passes the ECC test and is decoded to obtain K-bit dataword, at 806, the flash controller sends the K-bit dataword to the flash data processor 720 in the SSD controller 710 through the external electrical connection 713 on the PCB 702. The flash data processor 720 does not need to perform any decoding using the stronger ECC circuit 724, and the process 800 ends at step 807. The SSD controller 710 can then send the decoded K-bit dataword to the host device through the host interface 712 in response to the read command.

If the flash controller 734 determines that a result of decoding the N-bit codeword fails the ECC test with the weaker ECC circuit 738 or the weaker ECC circuit 738 fails to decode the N-bit codeword, at 808, the flash controller 734 sends the N-bit codeword to the SSD controller 710, e.g., the flash data processor 720, through the external electrical connection 713 on the PCB 702. The stronger ECC circuit 724 in the flash data processor 720 then decodes the N-bit codeword according to a stronger decoding algorithm, e.g., the min-sum related algorithm. The decoding of the N-bit codeword is a hard decision decoding.

At 810, the SSD controller 710, e.g., the flash data processor 720, determines whether a result of decoding the N-bit codeword passes the ECC test with the stronger ECC circuit 724 or whether the stronger ECC circuit 724 can decode the N-bit codeword. If the N-bit codeword passes the ECC test and is decoded to obtain K-bit dataword by the stronger ECC circuit 724, the process 800 ends at step 807. The SSD controller 710 can then send the decoded K-bit dataword to the host device through the host interface 712 in response to the read command.

If the N-bit codeword fails the ECC test, at 812, the SSD controller 710 informs, e.g., by sending a request to, the flash controller 734 to read the N-bit codeword with soft bits from the flash memory 732. A number of soft bits for each data bit in the N-bit codeword determines the number of times the N-bit codeword read from the flash memory 732, e.g., with a corresponding series of sequential read voltages.

At 814, the flash controller 734 directly sends the soft bits of the N-bit codeword to the SSD controller 710, e.g., the flash data processor 720, through the electrical connection 713 on the PCB 702, bypassing the weaker ECC circuit 738. That is, the weaker ECC circuit 738 does not perform any decoding on the soft bits of the N-bit codeword.

At 816, the stronger ECC circuit 722 in the flash data processor 720 decodes the soft bits of the N-bit codeword to obtain K-bit dataword, e.g., according to the min-sum related algorithm. The decoding is a soft decision decoding. The process 800 then ends at step 807. The SSD controller 710 can then send the decoded K-bit dataword to the host device through the host interface 712 in response to the read command.

In some implementations, the SSD controller 710 receives a write command from the host device through the host interface 712. The write command indicates to store a K-bit dataword in a flash memory 732. The SSD controller 710, e.g., the flash data processor 720, can directly send the K-bit dataword to a flash controller 734 in a corresponding flash memory device 730 including the flash memory 732, bypassing the stronger ECC circuit 724. The flash controller 734 can encode the K-bit dataword using the weaker ECC circuit 738 to obtain an N-bit codeword. The flash controller 734 can then program or write the N-bit codeword in the flash memory 732. In some implementations, if the weaker ECC circuit 738 does not have the capability to encode the K-bit dataword, the SSD controller 710 can use the stronger ECC circuit 722 to encode the K-bit dataword to obtain N-bit codeword, and then send the N-bit codeword to the flash controller 734 for storing in the flash memory 732.

Figure 9:
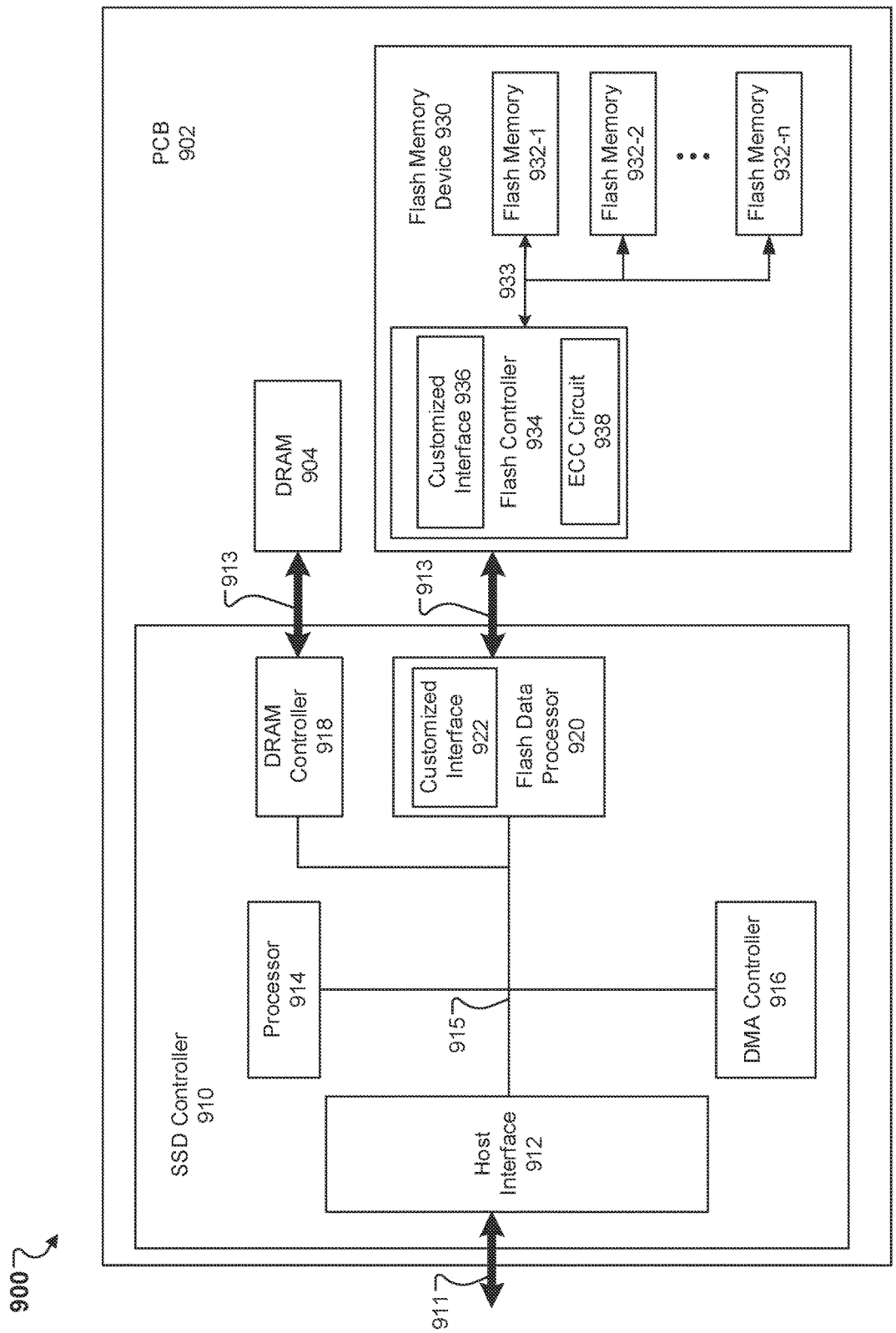
FIG. 9 illustrates another example memory system including a system controller and a memory device having an ECC circuit and multiple memories.

FIG. 9 illustrates another example memory system, e.g., an SSD 900, including a system controller, e.g., an SSD controller 910, and memory devices, e.g., a DRAM 904 and a flash memory device 930. The SSD 900 can be the memory system 110 of FIG. 1, the SSD controller 910 can be the system controller 112 of FIG. 1, and the memory device 930 can be the memory device 116 of FIG. 1.

The SSD 900 is similar to the SSD 300 of FIG. 3 or the SSD 700 of FIG. 7, except that, instead of providing a flash controller having an ECC circuit for each flash memory (e.g., as illustrated in FIGS. 3 and 7), the SSD 900 provides the flash memory device 930 for a plurality of flash memories 932-1, 932-2, . . . , 932-n (referred to generally as flash memories 932 or individually as flash memory 932).

The flash memory device 930 includes a flash controller 934 having an ECC circuit 938 configured to perform error correction coding for at least one of the flash memories 932. The flash controller 934 can also include a customized interface 936, e.g., the customized interface 336 of FIG. 3 or 736 of FIG. 7, configured to communicate with the SSD controller 910. The flash controller 934 can be implemented as a die or chip. Each flash memories 932 can be an individual die or chip. The flash controller 934 and the flash memories 932 can be packaged in the flash memory device 930. The flash memory device 930 can include an internal electrical connection 933, e.g., the electrical connection 333 of FIG. 3 or 733 of FIG. 7, that couples the flash controller 934 to each of the flash memories 932.

Similar to the SSD 300 of FIG. 3 or the SSD 700 of FIG. 7, the SSD controller 910 and the memory devices 904, 930 can be arranged on an electrical connection board, e.g., a PCB 902. The PCB 702 can be the PCB 302 of FIG. 3 or 702 of FIG. 7. The PCB 902 can include a shared bus. The SSD controller 910 can communicate with each of the memory devices 904, 930 by an electrical connection 913 provided by the shared bus on the PCB 902.

Similar to the SSD controller 310 of FIG. 3 or 710 of FIG. 7, the SSD controller 910 includes a host interface 912, e.g., the host interface 312 of FIG. 3 or 712 of FIG. 7, that is configured to communicate with a host device, e.g., the host device 120 of FIG. 1, through an electrical connection 911, e.g., the electrical connection 311 of FIG. 3 or 711 of FIG. 7. The host interface 912 can communicate with the host device according to an interface protocol, e.g., a bus interface protocol such as a NAND interface protocol.

Also similar to the SSD controller 310 of FIG. 3 or 710 of FIG. 7, the SSD controller 910 includes a processor 914, a DMA controller 916, and a DRAM controller 918. The processor 914 can be the processor 113 of FIG. 1. The DRAM controller 918 is configured to communicate with the DRAM 904 and control data transfer between the SSD controller 910 and the DRAM 904. The DRAM controller 918 can be the DRAM controller 318 of FIG. 3 or 718 of FIG. 7. The DMA controller 916 can be configured to control data transfer between the SSD controller 910 and the memory devices 904, 930. In some implementations, the flash memory device 930, e.g., the flash controller 934, includes a DMA controller that can arbitrate data transfer to or from the plurality of flash memories 932 according to a criteria, e.g., a priority.

The SSD controller 910 can also include an internal bus coupled to components in the SSD controller 910. Each of the components can be a chip, and the SSD controller 910 can be a multi-chip package that is arranged on the PCB 902. The internal bus provides electrical connections 915, e.g., the electrical connection 315 of FIG. 3 or 715 of FIG. 7, for the components such that the components can communicate with one another through the electrical connections 915.

The SSD 910 includes a flash data processor 920 for the flash memory device 930. In some implementations, the flash data processor 920 can be similar to the flash data processor 320 of FIG. 3, and can be configured to buffer data and/or process data to or from the flash memory device 930. The flash data processor 920 can include a customized interface 922 corresponds to the customized interface 936 in the flash controller 934. The customized interface 922 is configured to transfer data between the flash data processor 920 or the SSD controller 910 and the flash controller 934 or the flash memory device 930. The customized interface 922 in the SSD controller 910 and the customized interface 936 in the flash memory device 930 can communicate with each other according to an interface protocol, e.g., the interface protocol 400 of FIG. 4. The interface protocol can be implemented in any suitable format and with any suitable pin number. In some examples, the interface protocol can be same as a flash interface protocol, e.g., a NAND flash interface protocol. In some examples, the interface protocol can have a pin number less than that of the flash interface protocol. In some examples, the interface protocol can a high speed communication protocol, e.g., with a communication protocol with Serializer/Deserializer (SerDes).

In some implementations, the flash data processor 920 can be similar to the flash data processor 720 of FIG. 7. The flash data processor 920 can include an ECC circuit having a stronger coding capability than the ECC circuit 938 in the flash controller 934. The ECC circuit in the flash data processor 920 can be similar to the stronger ECC circuit 724 of FIG. 7. The ECC circuit 938 can be similar to the ECC circuit 737 of FIG. 7.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specified integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specified to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A memory system comprising:
a system controller comprising a system-side error correction code (ECC) circuit; and
a memory device coupled to the system controller, the memory device comprising:
at least one memory; and
a memory controller coupled to the at least one memory, the memory controller comprising a memory-side ECC circuit configured to perform error correction coding for data received from at least one of the system controller or the at least one memory,
wherein the system-side ECC circuit has a stronger decoding capability than the memory-side ECC circuit in the memory controller, and
wherein the memory-side ECC circuit is configured to decode data according to a weaker decoding algorithm, and the system-side ECC circuit is configured to decode data according to a stronger decoding algorithm,
wherein the memory controller is configured to:
in response to determining that the memory-side ECC circuit fails to decode the data according to the weaker decoding algorithm, send the data to the system controller,
wherein the system controller is configured to:
decode the data using the system-side ECC circuit according to the stronger decoding algorithm;
in response to determining that the system-side ECC circuit fails to decode the data according to the stronger decoding algorithm, send a request to the memory controller for reading soft bits of the data from the at least one memory; and
in response to receiving the soft bits of the data from the memory controller, decode the soft bits of the data using the system-side ECC circuit according to the stronger decoding algorithm to obtain decoded data, the decoded data having a smaller size than the data, and
wherein the memory controller is configured to:
send the soft bits of the data to the system controller, without decoding the soft bits of the data using the memory-side ECC circuit.

2. The memory system of claim 1, wherein the memory controller is coupled to the system controller via a first type of electrical connection, and the memory controller is coupled to the at least one memory via a second type of electrical connection, and
wherein an impedance of the second type of electrical connection is smaller than an impedance of the first type of electrical connection.

3. The memory system of claim 2, further comprising an electrical connection board,
   wherein the system controller and the memory device are respectively arranged on the electrical connection board, and
   wherein the first type of electrical connection is implemented with a shared bus of the electrical connection board, and wherein the second type of electrical connection is implemented with an internal bus in the memory device.

4. The memory system of claim 2, wherein the system controller comprises at least one of:
   a first interface configured to communicate with a host device via a third type of electrical connection according to a first interface protocol, wherein the impedance of the second type of electrical connection is smaller than an impedance of the third type of electrical connection,
   a second interface configured to communicate with the memory controller via the first type of electrical connection according to a second interface protocol, or
   a third interface configured to communicate with the system controller via the first type of electrical connection according to the second interface protocol.

5. The memory system of claim 2, wherein the memory controller is configured to:
   receive the data from the system controller via the first type of electrical connection;
   encode the data to obtain encoded data using the memory-side ECC circuit, the encoded data having a larger size than the data; and
   write the encoded data in the at least one memory via the second type of electrical connection.

6. The memory system of claim 2, wherein the memory controller is configured to:
   read the data from the at least one memory via the second type of electrical connection;
   decode the data to obtain decoded data using the memory-side ECC circuit, the decoded data having a smaller size than the data; and
   send the decoded data to the system controller via the first type of electrical connection.

7. The memory system of claim 2, wherein the memory controller is configured to:
   read soft bits of the data from the at least one memory via the second type of electrical connection;
   decode the soft bits of the data to obtain decoded data using the memory-side ECC circuit according to a soft decision decoding algorithm, the decoded data having a smaller size than the data; and
   send the decoded data to the system controller via the first type of electrical connection.

8. The memory system of claim 1, further comprising a second memory device coupled to both the system controller and the memory device,
   wherein the second memory device has a faster response speed than the memory device.

9. The memory system of claim 1, wherein the at least one memory comprises a plurality of memories each coupled to the memory controller, and
   wherein the memory-side ECC circuit is configured to perform error correction coding for corresponding data associated with each of the plurality of memories.

10. A memory system comprising:
   a system controller; and
   a plurality of memory devices,
   wherein each of the plurality of memory devices is coupled to the system controller and comprises:
      a respective memory; and
      a respective memory controller coupled to the respective memory, the respective memory controller comprising a corresponding ECC circuit configured to perform corresponding error correction coding for corresponding data received from at least one of the respective memory or the system controller,
   wherein the system controller comprises a plurality of data processors, and each of the plurality of data processors is configured to communicate with a respective memory device of the plurality of memory devices,
   wherein the corresponding ECC circuit in the respective memory controller of each of the plurality of memory devices is a memory-side ECC circuit,
   wherein each of the plurality of data processors comprises a system-side ECC circuit that has a stronger decoding capability than the memory-side ECC circuit,
   wherein the memory-side ECC circuit is configured to decode data according to a weaker decoding algorithm, and the system-side ECC circuit is configured to decode data according to a stronger decoding algorithm, and
   wherein, for at least one memory device of the plurality of memory devices,
   the respective memory controller is configured to:
      in response to determining that the memory-side ECC circuit fails to decode the data according to the weaker decoding algorithm, send the data to the system controller,
   the system controller is configured to:
      decode the data using the system-side ECC circuit in a data processor corresponding to the memory device, according to the stronger decoding algorithm;
      in response to determining that the system-side ECC circuit fails to decode the data according to the stronger decoding algorithm, send a request to the respective memory controller for reading soft bits of the data from the respective memory in the memory device; and
      in response to receiving the soft bits of the data from the respective memory controller, decode the soft bits of the data using the system-side ECC circuit according to the stronger decoding algorithm to obtain decoded data, the decoded data having a smaller size than the data, and
   the respective memory controller is configured to:
      send the soft bits of the data to the system controller, without decoding the soft bits of the data using the memory-side ECC circuit.

11. The memory system of claim 10, wherein the plurality of memory devices comprise a first memory device and a second memory device, and
   wherein the second memory device has a faster response speed than the first memory device.

12. The memory system of claim 10, wherein, for at least one memory device of the plurality of memory device,
   the respective memory controller is coupled to the system controller via a first type of electrical connection, and the respective memory controller is coupled to the respective memory via a second type of electrical connection, and
   an impedance of the second type of electrical connection is smaller than an impedance of the first type of electrical connection.

13. The memory system of claim 12, further comprising an electrical connection board,
  wherein the system controller and the plurality of memory devices are respectively arranged on the electrical connection board, and
  wherein the first type of electrical connection is implemented with a shared bus of the electrical connection board, and the second type of electrical connection is implemented with an internal bus in each of the plurality of memory devices.

14. The memory system of claim 12, wherein the respective memory controller is configured to:
  receive the data from the system controller via the first type of electrical connection;
  encode the data to obtain encoded data using the corresponding ECC circuit in the respective memory controller, the encoded data having a larger size than the data; and
  write the encoded data in the respective memory via the second type of electrical connection.

15. The memory system of claim 12, wherein the respective memory controller is configured to:
  read the data from the respective memory via the second type of electrical connection;
  decode the data to obtain decoded data using the corresponding ECC circuit, the decoded data having a smaller size than the data; and
  send the decoded data to the system controller via the first type of electrical connection.

16. The memory system of claim 12, wherein the respective memory controller is configured to:
  read soft bits of the data from the respective memory via the second type of electrical connection;
  decode the soft bits of the data to obtain decoded data using the corresponding ECC circuit according to a soft decision decoding algorithm, the decoded data having a smaller size than the data; and
  send the decoded data to the system controller via the first type of electrical connection.

\* \* \* \* \*